(12) United States Patent
Chuang

(10) Patent No.: US 6,871,975 B2
(45) Date of Patent: Mar. 29, 2005

(54) LIGHT MODULE AND FLAT PANEL DISPLAY INCLUDING THE LIGHT MODULE

(75) Inventor: Meng Ju Chuang, Hsinchu (TW)

(73) Assignee: Toppoly Optoelectronics Corp., Chu-Nan (TW)

(*) Notice: Subject to any disclaimer, the term of this patent is extended or adjusted under 35 U.S.C. 154(b) by 0 days.

(21) Appl. No.: 10/444,006

(22) Filed: May 22, 2003

(65) Prior Publication Data

US 2004/0080924 A1 Apr. 29, 2004

(30) Foreign Application Priority Data

Oct. 25, 2002 (TW) .......................... 91125211 A

(51) Int. Cl.$^7$ .............................................. G01D 11/28
(52) U.S. Cl. ........................... 362/27; 362/31; 362/555; 362/561
(58) Field of Search ............................ 362/27, 31, 26, 362/800, 561, 257, 560, 555, 559, 511, 545; 385/146

(56) References Cited

U.S. PATENT DOCUMENTS

| | | | | |
|---|---|---|---|---|
| 5,381,309 A | * | 1/1995 | Borchardt | .................. 362/31 |
| 5,404,277 A | * | 4/1995 | Lindblad | .................. 362/31 |
| 2002/0070914 A1 | | 6/2002 | Bruning et al. | |

* cited by examiner

*Primary Examiner*—Thomas M. Sember
*Assistant Examiner*—Bao Q Truong
(74) *Attorney, Agent, or Firm*—Quintero Law Office

(57) ABSTRACT

A light module and a flat panel display including the light module. The light module includes a printed circuit board having a first surface and a second surface; a first light source disposed on the first surface of the printed circuit board; a second light source disposed on the second surface of the printed circuit board; and a light guiding plate disposed adjacent to the printed circuit board, for guiding light emitted from the first and/or the second light sources to a first surface of the light guiding plate.

22 Claims, 5 Drawing Sheets

LIGHT MODULE AND FLAT PANEL DISPLAY INCLUDING THE LIGHT MODULE

BACKGROUND OF THE INVENTION

1. Field of the Invention

The present invention relates to a light module, and more particularly to a light module, in which light sources are provided on upper and lower surfaces of a single printed circuit board.

2. Description of the Prior Art

In recent years, dual face flat panel displays have developed quickly and have been applied in electronic products such as mobile phones. Generally, the conventional dual face flat panel display uses only one light source for two display panels. Therefore, the light source cannot be effectively utilized. The brightness (luminance) is unstable, that is, the brightness of one face is lower, and the brightness of the other face cannot achieve the best result.

In order to improve the above disadvantage, some researchers use two light sources to supply two display panels. FIG. 1 is a cross-section of a conventional dual-faced LCD, which includes upper and lower LCD panels 100a and 100b, and a light module M interposed between the two LCD panels. The light module M includes two printed circuit boards 200a and 200b, two sets of light sources 300a and 300b, two light guiding plates 400a and 400b, reflector sheets 500 and 520, and two sets of optical sheets 600a and 600b. The optical sheet 600a includes one diffuser sheet 620a and two prism sheets 640a and 660a. The same, the optical sheet 600b includes one diffuser sheet 620b and two prism sheets 640b and 660b.

Still referring to FIG. 1, the dual-faced flat panel display uses two printed circuit boards and a light source is provided on each printed circuit board. Specifically, the light source 300a is disposed on the printed circuit board 200a, and the light source 300b is disposed on the printed circuit board 200b. The light emitted from the light source 300a passes the light guiding plate 400a, the reflector sheet 500, the optical sheet 600a, enters the LCD panel 100a, and reaches face A. The light emitted from the light source 300b passes the light guiding plate 400b, the reflector sheet 500, the optical sheet 600b, enters the LCD panel 100b, and reaches face B.

The above structure has the following disadvantages:

(1) Face B has a much lower brightness than face A and it is difficult to control the stability standard of brightness.
(2) The light source cannot be effectively utilized and the brightness of face A cannot achieve the best result.
(3) The flat panel display with high brightness on both faces cannot be produced.
(4) The size along the y-axis direction is larger.
(5) Since the two light sources are disposed on two printed circuit boards respectively, two power supplies are needed. Thus, the structure is complicated and is not easy to assemble.

SUMMARY OF THE INVENTION

An object of the present invention is to solve the above-mentioned problem and provide a light module, in which two sets of light sources are disposed on upper and lower surfaces of the same printed circuit board. Only one power supply is needed, and the structure is simple and easy to assemble.

Another object of the present invention is that when the light module is used in a dual-faced flat panel display, the upper and lower light guiding plates can directly receive light. Therefore, the quantities of light sources on upper and lower surfaces of the printed circuit board can be increased or decreased respectively according to requirements, thus increasing or decreasing the brightness on upper and lower faces respectively.

To achieve the above objects, the light module of the present invention includes a printed circuit board having a first surface and a second surface; a first light source disposed on the first surface of the printed circuit board; a second light source disposed on the second surface of the printed circuit board; and a light guiding plate disposed adjacent to the printed circuit board, for guiding light emitted from the first and/or the second light sources to a first surface of the light guiding plate.

The present invention also provides a flat panel display including a printed circuit board having a first surface and a second surface; a first light source disposed on the first surface of the printed circuit board; a second light source disposed on the second surface of the printed circuit board; a light guiding plate disposed adjacent to the printed circuit board, for guiding light emitted from the first and/or the second light sources to a first surface of the light guiding plate; and a display panel disposed on the first surface of the light guiding plate.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE INVENTION

Figure 1:
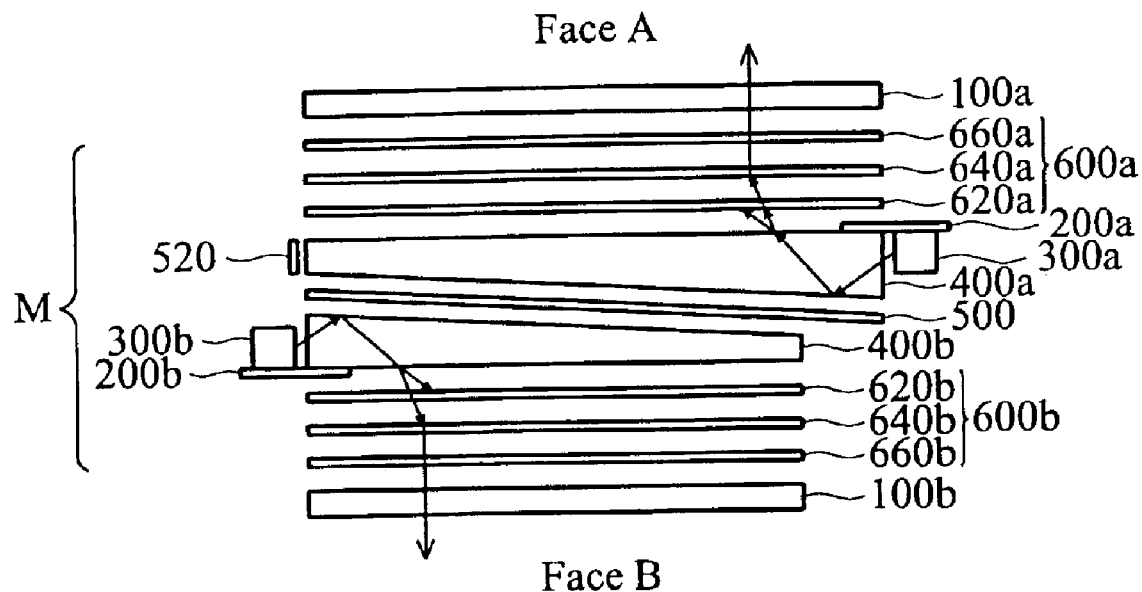
FIG. 1 is a cross-section of a conventional dual-faced flat panel display.
Figure 2:
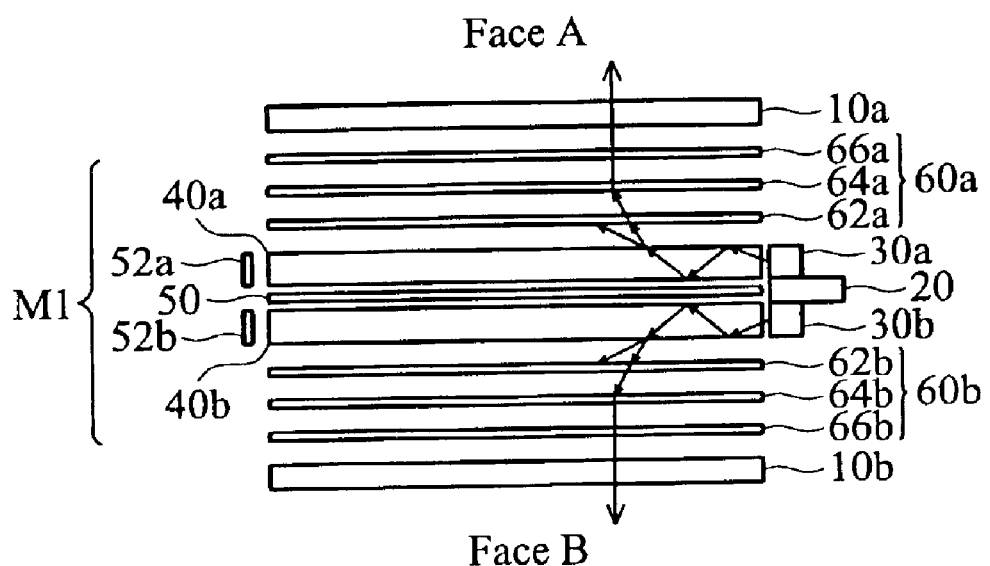
FIG. 2 is a cross-section of a dual-faced flat panel display according to a first embodiment of the present invention.

FIG. 2 is a cross-section of a flat panel display according to a first preferred embodiment of the present invention. The flat panel display of FIG. 2 is dual-faced and the two display panels are of approximately the same size. The flat panel display includes an upper display panel 10a, a lower display panel 10b and a light module M1 interposed between the two display panels. The display panel can be a liquid crystal display (LCD) panel. The light module M1 includes a printed circuit board 20, two sets of light sources 30a and 30b, two light guiding plates 40a and 40b, reflector sheets 50, 52a, and 52b, and two sets of optical sheets 60a and 60b.

Still referring to FIG. 2, the feature of the present invention is that only one printed circuit board 20 is used and the two sets of light sources 30a and 30b are respectively disposed on upper and lower surfaces of the printed circuit board 20. The light guiding plate 40a is disposed adjacent to the light source 30a. The light emitted from the light source 30a first enters the light guiding plate 40a, is reflected by the reflector sheet 50, passes the light guiding plate 40a and the optical sheet 60a, enters the LCD panel 10a, and finally reaches face A. Moreover, the light guiding plate 40b is disposed adjacent to the light source 30b. The light emitted from the light source 30b first enters the light guiding plate 40b, is reflected by the reflector sheet 50, passes the light guiding plate 40b and the optical sheet 60b, enters the LCD panel 10b, and finally reaches face B. Moreover, the reflector sheet 52a is disposed adjacent to the light guiding plate 40a and on the opposite side of the light source 30a. The reflector sheet 52b is disposed adjacent to the light guiding plate 40b and on the opposite side of the light source 30b. Since the light sources 30a and 30b are located on the back sides of the LCD panels 10a and 10b respectively, they are referred to as back-lights.

The shape of the light guiding plate is not limited. For example, the light guiding plate can have a wedge-shaped cross section or a rectangular shape cross section.

Generally, the optical sheet can include a diffuser sheet, a prism sheet, or a combination thereof. The diffuser sheet has a light scattering effect for evenly distributing the light emitted from the light source, and the prism sheet focuses scattered light to a certain degree to enhance the brightness. For example, in FIG. 2, the optical sheet 60a including one diffuser sheet 62a and two prism sheets 64a and 66a is provided on face A of the light guiding plate 40a. The optical sheet 60b including one diffuser sheet 62b and two prism sheets 64b and 66b are provided on face B of the light guiding plate 40b.

Figure 3A:
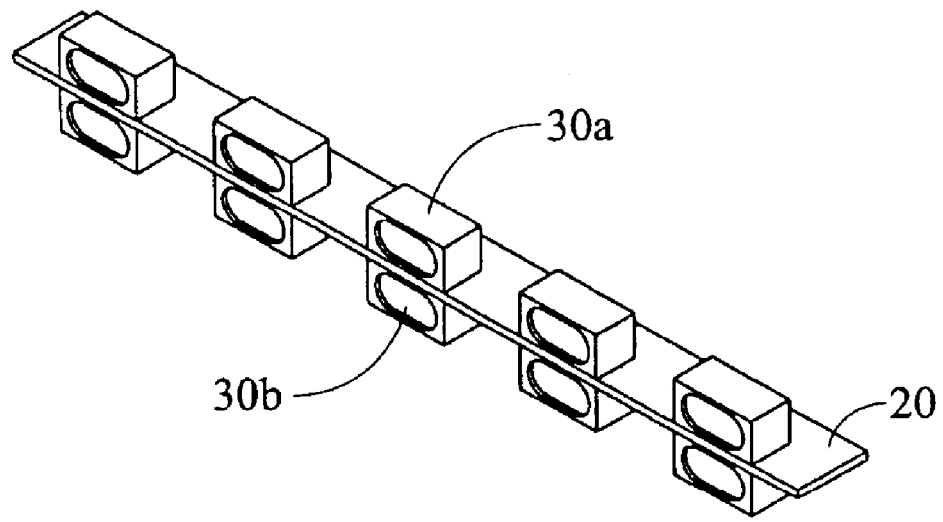
FIGS. 3A and 3B show the arrangement of the light sources on the printed circuit board of the present invention.

The printed circuit board 20 shown in FIG. 2 is of a linear shape and disposed on one side of the light guiding plates 40a and 40b. FIG. 3A is a perspective view of the printed circuit board 20 of FIG. 2. It shows that a plurality of light emitters are provided on upper and lower surfaces of the printed circuit board 20. For example, the light source can be a light emitting diode (LED). In FIG. 3, the light sources 30a and 30b are correspondingly aligned. The quantity of the light sources is not limited and can be determined according to the brightness requirement and the panel size.

Figure 3B:
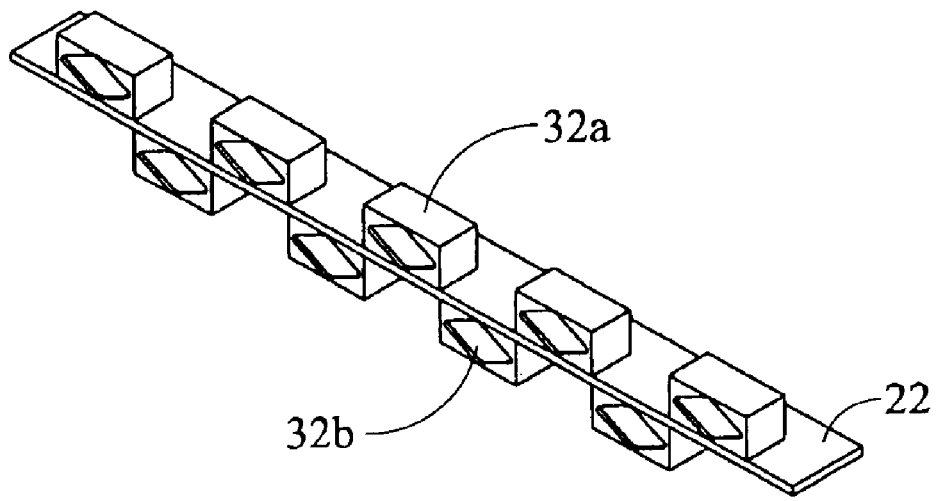

According to the present invention, the arrangement of the light sources on the upper and lower surfaces of the printed circuit board is not limited. In addition to FIG. 3A, FIG. 3B shows another arrangement of the light sources. In FIG. 3B, a plurality of light sources 32a are disposed on the upper surface of the printed circuit board 22, and a plurality of light sources 32b are disposed on the lower surface of the printed circuit board 22. The light sources 32a and 32b are alternatively aligned.

The printed circuit board used in the present invention can be a rigid or flexible printed circuit board. The flexible printed circuit board can be folded for use. Taking the linear shaped printed circuit board of FIG. 3A for an example, it can be rigid or flexible and the light sources are disposed on the upper and lower surfaces thereof. Or, alternatively, light sources are disposed on a single surface of a flexible printed circuit board and then the flexible printed circuit board is folded to make the surface without light sources contact, thus constituting a folded flexible printed circuit board having light sources on upper and lower surfaces.

Figure 4A:
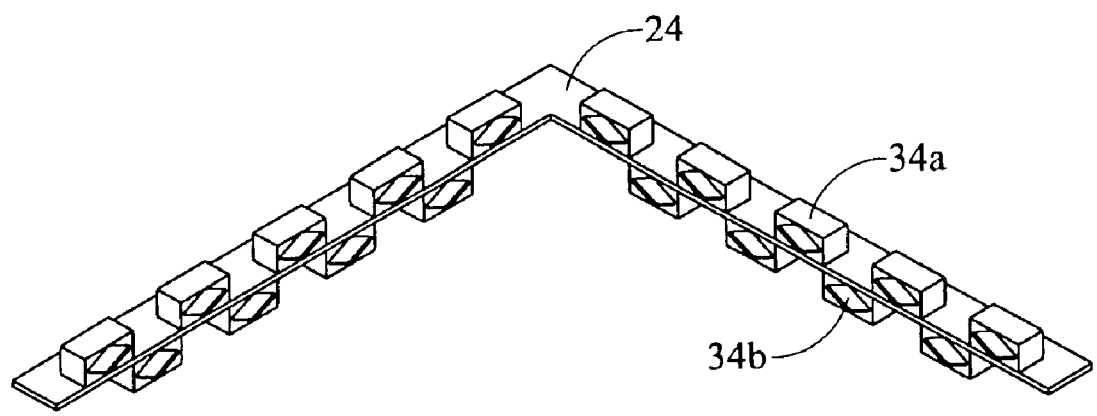
FIGS. 4A to 4C show the shape variation of the printed circuit board of the present invention.
Figure 4B:
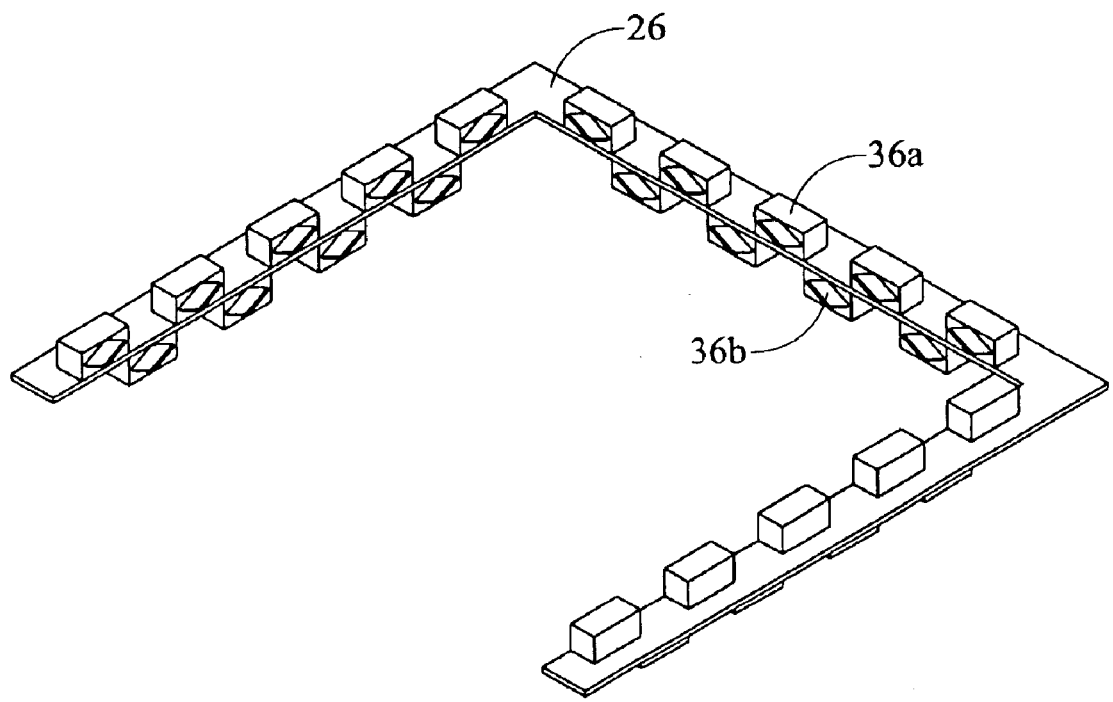
Figure 4C:
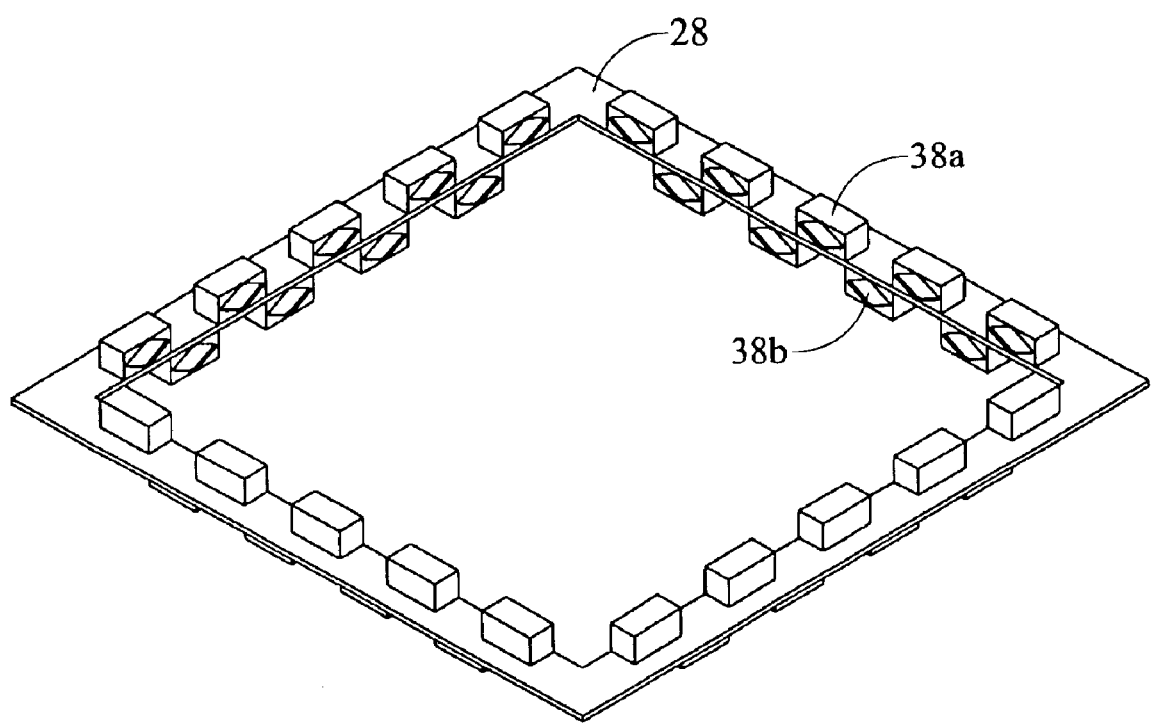

In addition to the linear shape, the printed circuit board of the present invention can have other shape variations. For example, the printed circuit board 24 of FIG. 4A is of L-shape and a plurality of light sources 34a are provided on the upper surface and a plurality of light sources 34b the lower surface. The L-shaped printed circuit board 24 can be disposed on two sides of the light guiding plates 40a and 40b of FIG. 2. FIG. 4B shows another printed circuit board 26 that is U-shaped, in which a plurality of light sources 36a are provided on the upper surface and a plurality of light sources 36b on the lower surface. The U-shaped printed circuit board 26 can be disposed on three sides of the light guiding plates 40a and 40b of FIG. 2. FIG. 4C shows another printed circuit board 28 that is of square or rectangular shape, in which a plurality of light sources 38a are provided on the upper surface and a plurality of light sources 38b on the lower surface. The square- or rectangular-shaped printed circuit board can be disposed around the light guiding plates 40a and 40b of FIG. 2.

In the dual-faced flat panel display of FIG. 2, the upper and lower light guiding plates 40a and 40b can receive light directly. Therefore, the quantity of light sources on the upper and lower surfaces of the printed circuit board 20 can be increased or decreased respectively according to requirements, thus increasing or decreasing the brightness on the upper and lower faces respectively.

Figure 5:
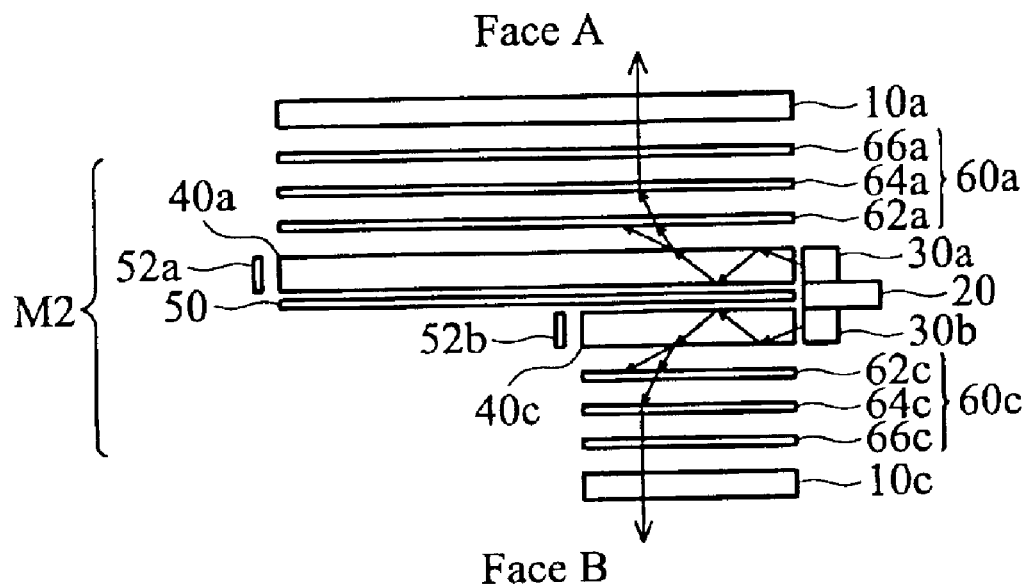
FIG. 5 is a cross-section of a dual-faced flat panel display according to a second preferred embodiment of the present invention.

FIG. 5 is a cross-section of a flat panel display according to a second preferred embodiment of the present invention. The flat panel display of FIG. 5 is dual-faced and the two display panels are of different size. In FIG. 5, the display panel on face B is smaller than that on face A. The structure of FIG. 5 is almost the same as FIG. 2. In the same way, only one printed circuit board 20 is used and the two sets of light sources 30a and 30b are respectively disposed on upper and lower surfaces of the printed circuit board 20. The difference is that in FIG. 5, the display panel on face B is smaller than that on face A. The elements on the face A portion in FIG. 5 are the same as in FIG. 2. The structure of FIG. 5 is simply described below. The dual-face LCD includes an upper LCD panel 10a, a lower LCD panel 10c, and a light module M2 interposed between the two LCD panels. The light module M2 includes a printed circuit board 20, two sets of light sources 30a and 30b, two light guiding plates 40a and 40c, reflector sheets 50, 52a, and 52b, and two sets of optical sheets 60a and 60c.

Still referring to FIG. 5, the optical sheet 60a is disposed on face A of the light guiding plate 40a and includes one diffuser sheet 62a and two prism sheets 64a and 66a. The optical sheet 60c is disposed on face B of the light guiding plate 40c and includes one diffuser sheet 62c and two prism sheets 64c and 66c.

Figure 6:
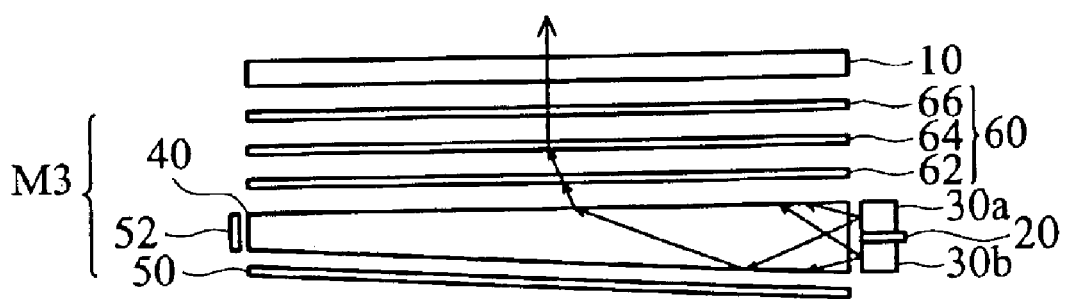
FIG. 6 is a cross-section of a single-faced flat panel display according to a third preferred embodiment of the present invention.

FIG. 6 is a cross-section of a flat panel display according to a third preferred embodiment of the present invention, which is a single-faced LCD. The structure of FIG. 6 is almost the same as face A of FIG. 2. In the same way, only one printed circuit board 20 is used and the two sets of light sources 30a and 30b are respectively disposed on upper and lower surfaces of the printed circuit board 20. The structure of FIG. 6 is simply described below. The single-faced LCD includes an LCD panel 10 and a light module M3 disposed below the LCD panel 10. The light module M3 includes a printed circuit board 20, two sets of light sources 30a and 30b, a light guiding plate 40, reflector sheets 50 and 52, and a set of optical sheets 60. The optical sheets 60 are disposed on the light guiding plate 40 and include one diffuser sheet 62 and two prism sheets 64 and 66. The light emitted from the light sources 30a and 30b first passes the light guiding plate 40, is reflected by the reflector sheet 50, passes the light guiding plate 40 and the optical sheet 60, and then enters the LCD panel 10.

The light module of the present invention can be suitable for use in transmissive, reflective, or transflective flat panel displays.

In conclusion, the light module of the present invention uses only one printed circuit board and light sources are provided on upper and lower surfaces of the single printed circuit board. The structure is simple and is easy to assemble. When the light module of the present invention applies to a dual-faced flat panel display, the upper and lower light guiding plates can directly receive light. Therefore, the quantity of light sources on upper and lower surfaces of the printed circuit board can be increased or decreased respectively according to requirements, thus increasing or decreasing the brightness on upper and lower faces respectively. Also, faces A and B can be designed to have a great difference in brightness.

The foregoing description of the preferred embodiments of this invention has been presented for purposes of illustration and description. Obvious modifications or variations are possible in light of the above teaching. The embodiments chosen and described provide an excellent illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A light module, comprising:
   a printed circuit board having a first surface and a second surface;
   a first light source disposed on the first surface of the printed circuit board;
   a second light source disposed on the second surface of the printed circuit board; and
   a light guiding plate disposed adjacent to an edge side of the printed circuit board, wherein a light generated from the first and/or second light sources travels sideward into the light guiding plate and is guided to a first surface to the light guiding plate.

2. The light module as claimed in claim 1, wherein the first and the second light sources are back lights.

3. The light module as claimed in claim 1, further comprising a reflector sheet disposed on a second surface of the light guiding plate, for reflecting light emitted from the first and/or the second light sources to the first surface of the light guiding plate.

4. The light module as claimed in claim 1, wherein the printed circuit board is of linear shape and disposed on one side of the light guiding plate.

5. The light module as claimed in claim 1, wherein the printed circuit board is L-shaped and disposed on two sides of the light guiding plate.

6. The light module as claimed in claim 1, wherein the printed circuit board is U-shaped and disposed on three sides of the light guiding plate.

7. The light module as claimed in claim 1, wherein the printed circuit board is of square or rectangular shape and surrounds the light guiding plate.

8. The light module as claimed in claim 1, wherein the first and the second light sources have a plurality of light emitters.

9. The light module as claimed in claim 8, wherein the first and the second light sources are correspondingly aligned.

10. The light module as claimed in claim 8, wherein the first and the second light sources are alternatively aligned.

11. The light module as claimed in claim 1, wherein the first and the second light sources are light emitting diodes (LEDs).

12. The light module as claimed in claim 1, further comprising an optical sheet disposed on the first surface of the light guiding plate.

13. The light module as claimed in claim 12, wherein the optical sheet is a diffuser sheet, a prism sheet, or a combination thereof.

14. A flat panel display, comprising:
    a printed circuit board having a second surface;
    a first light source disposed on the first surface of the printed circuit board;
    a second light source disposed on the second surface of the printed circuit board;
    a light guiding plate disposed adjacent to an edge side of the printed circuit board, wherein a light generated from the first and/or second light sources travels sideward into the light guiding plate and is guided to a first surface of the light guiding plate; and
    a display panel disposed on the first surface of the light guiding plate.

15. The flat panel display as claimed in claim 14, wherein the first and the second light sources are back lights.

16. The flat panel display as claimed in claim 14, wherein the display panel is a liquid crystal display panel.

17. The flat panel display as claimed in claim 14, wherein the flat panel display includes one display panel and one light guiding plate to constitute a single-face flat panel display.

18. A dual-face flat panel display, comprising:
    a printed circuit board having a first surface and a second surface;
    a first light source disposed on the first surface of the printed circuit board;
    a second light source disposed on the second surface of the printed circuit board;
    a first light guiding plate disposed adjacent to an edge side of the first source on the printed circuit board, wherein a first light generated from the first light source travels sideward into the first light guiding plate and is guided to a first surface of the first light guiding plate;
    a first display panel disposed on the first surface of the first light guiding plate;
    a second light guiding plate dipsosed adjacent to an edge side of the second light source on the printed circuit board, wherein a second light generated from the second light source travels sideward into the second light guiding plate and is guided to a first surface of the second light guiding plate; and
    a second display panel disposed on the first surface of the second light guiding plate.

19. The dual-face flat panel display as claimed in claim 18, further comprising a first reflector sheet disposed between the first and second light guiding plates.

20. The dual-face flat panel display as claimed in claim 19, further comprising a second reflector sheet disposed adjacent to an edge side of the first light guiding plate and on an opposite side of the first light source.

21. The dual-face flat panel display as claimed in claims 20, further comprising a third reflector sheet disposed adjacent to an edge side of the second light guiding plate and on an opposite side of the second light source.

22. The dual-face flat panel display as claimed in claim 18, wherein the first and the second light sources are light emitting diodes (LEDs).

* * * * *